United States Patent
Hikmet et al.

(10) Patent No.: US 10,679,975 B2
(45) Date of Patent: Jun. 9, 2020

(54) LIGHTING DEVICE WITH UV LED

(71) Applicant: SIGNIFY HOLDING B.V., Eindhoven (NL)

(72) Inventors: Rifat Ata Mustafa Hikmet, Eindhoven (NL); Ties Van Bommel, Horst (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 16/347,804

(22) PCT Filed: Nov. 14, 2017

(86) PCT No.: PCT/EP2017/079123
§ 371 (c)(1),
(2) Date: May 6, 2019

(87) PCT Pub. No.: WO2018/091433
PCT Pub. Date: May 24, 2018

(65) Prior Publication Data
US 2019/0355703 A1  Nov. 21, 2019

(30) Foreign Application Priority Data
Nov. 17, 2016 (EP) ..................... 16199349

(51) Int. Cl.
*H01L 25/13* (2006.01)
*H01L 25/075* (2006.01)
*H01L 33/48* (2010.01)
*H01L 33/50* (2010.01)
*H01L 33/60* (2010.01)
(Continued)

(52) U.S. Cl.
CPC ........ *H01L 25/0753* (2013.01); *H01L 33/486* (2013.01); *H01L 33/505* (2013.01); *H01L 33/60* (2013.01); *H01L 33/62* (2013.01); *H01L 25/167* (2013.01); *H01L 27/15* (2013.01);
(Continued)

(58) Field of Classification Search
CPC ...... H01L 33/508; H01L 27/15; H01L 25/167
See application file for complete search history.

(56) References Cited

U.S. PATENT DOCUMENTS 9,520,383 B2 * 12/2016 Kim ................. H01L 25/0753
2004/0145312 A1   7/2004 Ouderkirk et al.
(Continued)

FOREIGN PATENT DOCUMENTS

WO   2011011902 A1   2/2011

*Primary Examiner* — George R Fourson, III
(74) *Attorney, Agent, or Firm* — Daniel J. Piotrowski (57) ABSTRACT

The present invention relates to a lighting device comprising a plurality of light emitting diodes, LEDs. The plurality of LEDs is disposed on a substrate for emitting visible light from at least one first light output surface in an outgoing light direction. The lighting device includes also at least one ultra violet light emitting diode, UV LED, for emitting UV light from a second light output surface in the outgoing light direction. A phosphor layer is disposed on at least the plurality of LEDs such that the LEDs are covered by the phosphor layer. The second light output surface for emitting UV light from the at least one UV LED is mounted at a higher level than the at least first light output surface relative to the substrate in the outgoing light direction. The present invention also relates to a method for manufacturing the lighting device.

14 Claims, 4 Drawing Sheets

(51) Int. Cl.
*H01L 33/62* (2010.01)
*H01L 25/16* (2006.01)
*H01L 27/15* (2006.01)

(52) U.S. Cl.
CPC .... *H01L 33/508* (2013.01); *H01L 2933/0041* (2013.01); *H01L 2933/0066* (2013.01)

(56) References Cited

U.S. PATENT DOCUMENTS

| | | |
|---|---|---|
| 2010/0025700 A1 | 2/2010 | Jung et al. |
| 2012/0187428 A1* | 7/2012 | Leising .................. H01L 33/50 257/88 |
| 2015/0014715 A1* | 1/2015 | Hsing Chen ........ H01L 25/0753 257/89 |
| 2016/0136312 A1 | 5/2016 | Park et al. |
| 2017/0229429 A1* | 8/2017 | He ......................... B82Y 20/00 |
| 2018/0231191 A1* | 8/2018 | Shchekin .................. F21K 9/64 |
| 2019/0172819 A1* | 6/2019 | Bae ....................... H01L 25/167 |
| 2019/0239308 A1* | 8/2019 | Lee ........................ H05B 45/48 |

\* cited by examiner

LIGHTING DEVICE WITH UV LED

CROSS-REFERENCE TO PRIOR APPLICATIONS

This application is the U.S. National Phase application under 35 U.S.C. § 371 of International Application No. PCT/EP2017/079123, filed on Nov. 14, 2017, which claims the benefit of European Patent Application No. 16199349.8, filed on Nov. 17, 2016. These applications are hereby incorporated by reference herein.

TECHNICAL FIELD

The present invention generally relates to the field of lighting devices, and in particular to a lighting device comprising light emitting diodes (LEDs) and at least one Ultra violet light emitting diode (UV LED).

BACKGROUND

There is generally a growing interest in making more cost effective lighting devices with health benefits. Light sources producing artificial white light are being adopted at a high rate. Such light sources can produce high quality light with a color rendering index (CRI) beyond 90 with very high efficiencies. However, one of the problems of such light sources as compared with sun light is the absence of certain parts of the spectrum which have specific benefits to humans beyond providing visible light. For example, ultra violet (UV) light (albeit at very low intensities) is very important for production of vitamin D (or for crispy white light, skin tanning, disinfection, insect attraction, skin treatment, etc.). For this purpose, it is desired to introduce UV LEDs in combination with white and/or colored LEDs in lighting devices. UV LEDs produce normally light in the wavelength range of 200 nm to 400 nm. For production of vitamin D, the wavelength is normally in the range of 280 nm to 320 nm.

Chip on Board (CoB) relates to a process technology which is increasingly used for producing light sources. The CoB is basically a light source of multiple LED chips bonded directly to a substrate forming a single module. The cost effectiveness and efficiency of these light sources are making them very attractive. It may therefore be interesting to combine CoB with one or more UV light sources.

In general, there is a need for providing a lighting device with the above benefits of UV light and an improved lifetime.

US2004/145312 A1 discloses a light source which includes an LED that emits excitation light, a first flexible multilayer reflector that reflects at least a portion of visible light and transmits the excitation light, and a layer of phosphor material adjacent the flexible multilayer reflector. The phosphor material emits visible light when illuminated with the excitation light

SUMMARY

It would be advantageous to achieve a lighting device addressing one or more of the above mentioned issues. In particular, it would be desirable to obtain improved performance or operation of a lighting device in terms of longer lifetime.

To better address one or more of these issues, a lighting device having the features defined in the independent claim is provided. Preferable embodiments are defined in the dependent claims.

According to a first aspect of the present disclosure, a lighting device is provided. The lighting device comprises a plurality of light emitting diodes (LEDs) that are disposed on a substrate for emitting visible light from at least one first light output surface in an outgoing light direction. At least one ultra violet light emitting diode (UV LED) is provided for emitting UV light from a second light output surface in the outgoing light direction. A phosphor layer is disposed on at least the plurality of LEDs such that the LEDs are covered by the phosphor layer. The second light output surface for emitting UV light is mounted at a higher level than the at least one first light output surface relative to the substrate in the outgoing light direction. The lighting device provides visible light and UV light. The lighting device may comprise a light exit window. The visible light and UV light exits the lighting device through the light exit window. Visible light is light in the wavelength range of 400 nm to 800 nm.

It has been recognized that UV light (e.g. at 310 nm) tends to degrade much of the materials (e.g. polymers) which are used in the lighting device such that the lifetime of the lighting device is shortened. With the second light output surface for emitting UV light from said at least one UV LED is mounted at a higher level than said at least one first light output surface relative to the substrate in the outgoing light direction, this degradation can be reduced and the lifetime of the device improved. With such an arrangement of the second light output surface for emitting UV light, the outgoing light from the UV LED may not reach (or at least less) the phosphor layer or the LEDs and the degradation is thereby reduced.

It will be appreciated, that in some embodiments, the LEDs may be embedded in the phosphor layer disposed on the substrate.

In some embodiments, the LEDs or the UV LED may be attached to, or mounted on, the substrate.

In some embodiments each of the LEDs may have its own light output surface. Further, it will be appreciated that the first light output surface for emitting visible light may be the surface of the LED itself, the surface of the phosphor layer on top of the LED or another surface depending on the optical arrangement in the lighting device. Similarly, the second light output surface for emitting UV light may be the surface of the UV LED itself or another surface as will be further illustrated in at least some of the embodiments below.

It will also be appreciated that while it is herein referred to an UV LED, it may also be referred to an UV LED device in that the UV LED may not only comprise the physical diode or semiconductor junction at which the UV light is generated. Similarly, the LEDs configured to provide light in the visible range may be referred to as LED devices. Further, the LEDs mounted/disposed on the substrate and covered by the phosphor layer are configured to provide, together with the phosphor layer, at least visible light, as opposed to UV light as provided by the UV LED.

The phosphor layer is a layer comprising a material capable of absorbing light of a first wavelength range, as emitted by the LEDs, and emitting light of a second wavelength range as a result of the absorption of light of first wavelength range. In other words, the phosphor layer converts light of a first wavelength into light of another wavelength.

In an embodiment, the at least one UV LED may be covered by the phosphor layer. The phosphor layer may be on top of the at least one UV LED and may be thinner than the phosphor layer on top of the LEDs such that the second light output surface (of the at least one UV LED) may be mounted at a higher level than the at least one first light output surface relative to the substrate in the outgoing light direction.

In an embodiment, the at least one UV LED may be disposed on a base arranged on the substrate such that the second light output surface may be elevated relative to the at least one first light output surface in the outgoing light direction. The second light output surface may for example be arranged on top of (or above) the UV LED in the outgoing light direction. The second light output surface may in some embodiments be a light emitting part of the UV LED and it may also be a surface on top of the UV LED.

In an embodiment, the base may have a thickness which is larger than the thickness of the phosphor layer. With the base being thicker than the phosphor layer, the second light output surface may be arranged above the phosphor layer, thereby limiting (and possibly preventing/avoiding) UV light from reaching the phosphor layer and any other part of the lighting device.

In another embodiment, the base may be equipped with connectors to electrically connect the UV LED to the substrate. The connectors may be electrodes that connect the base on which the UV LED is mounted and connected with the substrate.

It will be appreciated that the base may be a part of the UV LED (or UV LED device) or may be a separate element.

The UV light emitted from a second light output surface of the at least one ultra violet light emitting diode, UV LED, is preferably not converted by the phosphor layer.

In an embodiment, the base may comprise a light transmitting material. This material may be a transparent material such as quartz, glass, a ceramic or polymeric material. In this embodiment, visible light output from the LEDs may be transmitted through the base.

In another embodiment, the base may comprise a light reflective material. This material may include a metal. The base may also include a layer or coating of scattering particles, thereby providing reflective properties. The scattering particles may be e.g. aluminum oxide (Al2O3), barium sulfate (BaSO4) and/or titanium dioxide (TiO2) in a polymer matrix such as a silicone matrix. The metal coating may be provided by deposition such as e.g. physical vapor deposition or chemical vapor deposition of aluminum (Al) or silver (Ag). With the base (of the UV LED) comprising light reflective material, the light from the plurality of LEDs that reaches the base may be reflected out in the outgoing light direction, thereby improving light out coupling (of the visible light).

According to some embodiments, the base of the UV LED may have a shape where a lateral width of the base close to the substrate may be larger than a lateral width of the base at the surface of the phosphor layer (as the base may extend from the substrate to the surface of the phosphor layer, i.e. through the phosphor layer). It will be appreciated that such a shape may also enhance light out coupling of the visible light.

According to an embodiment, a layer of light transmitting material may be disposed on top of the UV LED such that the second light output surface is elevated relative to the at least one first light emitting surface in the outgoing light direction. In some embodiments the light transmitting material may be e.g. glass or a polymeric material.

According to an embodiment, the substrate may comprise a hole configured to hold the at least one UV LED. The hole may in some embodiments extend through the whole substrate and the phosphor layer with a constant lateral width. However, in some embodiments, the hole may be wider at the interface with the substrate than at the surface of the phosphor layer. Thus, the hole may fit a base (of an UV LED) having a particular shape (as described above), wherein a lateral width of the base close to the substrate may be larger than the lateral width of the base at the surface of the phosphor layer. The hole may provide a fixed position for the UV LED.

According to an embodiment, the hole may be positioned at an edge or a center of the substrate.

According to another embodiment, the UV LED may be an individual surface mounted device, SMD UV LED. The SMD UV LED may be an alternative to using a hole in the substrate. The SMD UV LED may be disposed on the substrate without requiring electrical connection to the substrate.

According to an embodiment, the LEDs covered by the phosphor layer may be configured to produce white light or colored light or they may be configured to produce a combination of white and colored lights.

According to an embodiment, the substrate, the plurality of LEDs and the phosphor layer may together form a Chip on Board (CoB).

According to some embodiments, a lamp or a luminaire may comprise a lighting device as defined in any one of the preceding embodiments. The lamps may be any kind of spotlights or light bulbs.

According to a second aspect of the present disclosure, a method for manufacturing a lighting device is provided. The method comprises bonding a plurality of LEDs on a substrate for emitting visible light from at least one first light output surface in an outgoing light direction and electrically connecting the plurality of LEDs together. The at least one UV LED may be mounted on the substrate for emitting UV light from a second light output surface in the outgoing light direction. A phosphor layer may be provided on at least the plurality of LEDs such that the LEDs are covered by the phosphor layer. The second light output surface for emitting UV light from the at least one UV LED may be mounted at a higher level than the at least one first light output surface relative to the substrate in the outgoing light direction.

Further objects, features and advantages of the present invention will become apparent from the following detailed description, the drawings and the appended claims. Those skilled in the art will realize that different features of the present invention may be combined to create embodiments other than those described in the following. In particular, it will be appreciated that the features described in the preceding embodiments for defining the lighting device in accordance with the first aspect of the present disclosure may be combined with the method according to the second aspect of the present disclosure.

BRIEF DESCRIPTION OF THE DRAWINGS

These and other aspects will now be described in more detail with reference to the appended drawings showing embodiments of the present invention.

All the figures are schematic, not necessarily to scale, and generally only show parts which are necessary in order to elucidate the embodiments, wherein other parts may be omitted or merely suggested. Like reference numerals refer to like elements throughout the description.

DETAILED DESCRIPTION OF EMBODIMENTS

The present aspect and embodiments will now be described more fully hereinafter with reference to the accompanying drawings. The invention may, however, be embodied in many different forms and should not be construed as limited to the embodiments set forth herein; rather, these embodiments are provided for thoroughness and completeness, and fully convey the scope of the present aspects to the skilled person.

Figure 1:
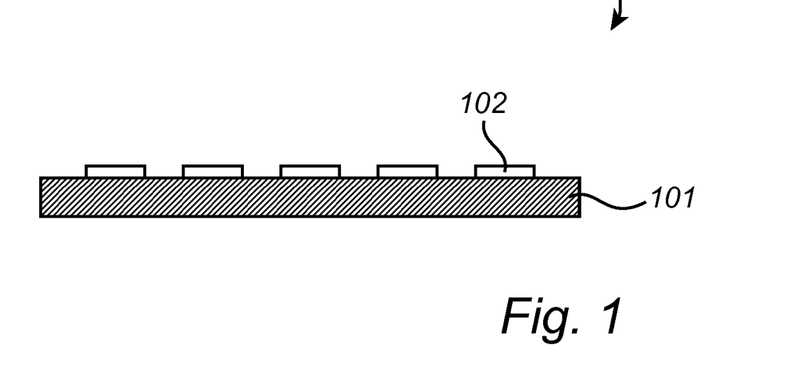
FIG. 1 shows a side view of a lighting device with a substrate and a plurality of LEDs.

FIG. 1 shows a plurality of LEDs 102 mounted on a substrate 101. In the present embodiment, the plurality of LEDs is mounted on a common substrate 101. It will be appreciated that in other embodiments each of the LEDs may be mounted on its own substrate. The LEDs 102 are laterally spaced from each other and are oriented for emitting light along an outgoing light direction (upwards on the figure). The LEDs 102 may be configured to emit visible light.

Figure 2:
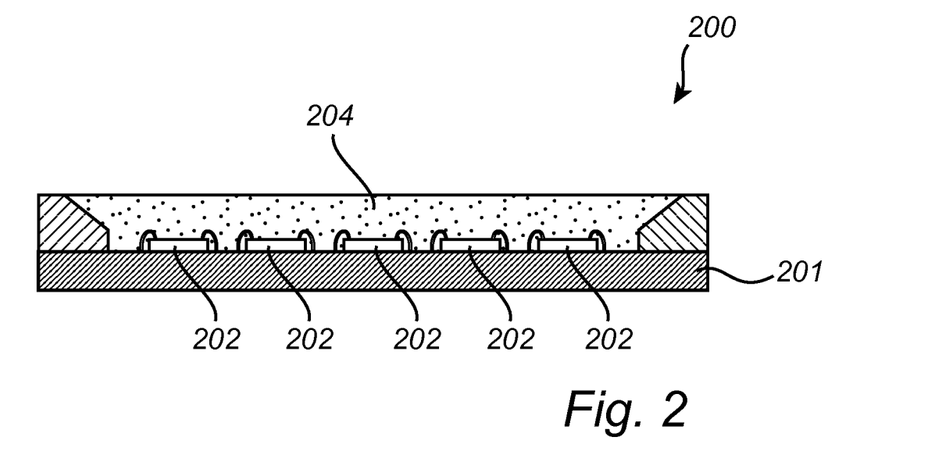
FIG. 2 shows a side view of a lighting device with a plurality of LEDs covered by a phosphor layer.

FIG. 2 shows an example embodiment of a lighting device 200, where the plurality of LEDs 202 may be covered by a phosphor layer 204 on the substrate 201. In particular, the LEDs 202 are embedded in the phosphor layer 204. FIG. 2 also illustrates the electrical connections between the LEDs 202 and the substrate 201.

The substrate 201, the plurality of LEDs 202 and the phosphor layer 204 covering the LEDs 202 may form a Chip on Board (CoB). The CoB may provide for example improved compactness due to a smaller size of the chips, higher intensity of the light, particularly at short distance, and higher uniformity, even at short working distances. The CoB further has enhanced thermal performance for improved lifetime, stability and reliability.

Figure 3:
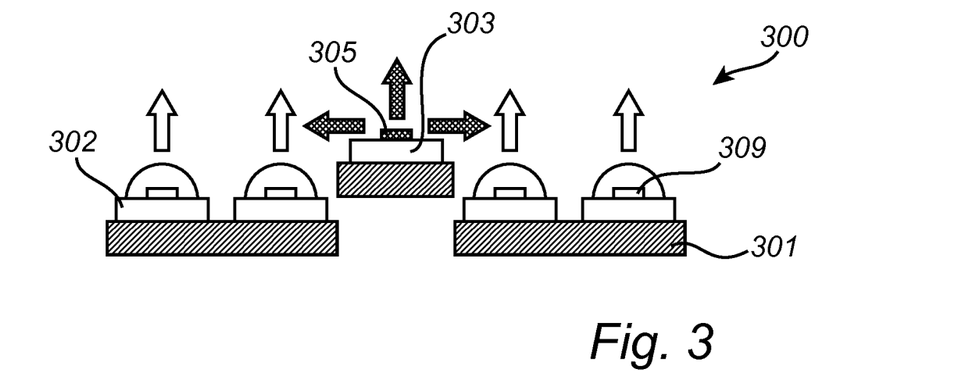
FIG. 3 shows a side view of a lighting device in which an UV LED is to be mounted among the LEDs on the substrate.

FIG. 3 is a representation of a lighting device in which an UV LED 303 is to be mounted on the substrate 301 among a plurality of LEDs 302. In this representation, as compared to the lighting device 200 shown in FIG. 2, each of the LEDs 302 includes its own phosphor layer, i.e. each of the LEDs 302 with their respective phosphor layers are mounted as separate devices on the substrate 302. The white arrows show the outgoing light direction, i.e. the direction along which the LEDs 302 emit visible light from the lighting device 300. FIG. 3 illustrates also with the black arrows that the UV LED 303 may emit UV light along the outgoing light direction but also in lateral directions (or radially if the outgoing light direction is considered to coincide with an axial direction of the lighting device), i.e. in a direction perpendicular to the outgoing light direction. FIG. 3 illustrates that when the UV LED 303 is arranged with its second light output surface 305 at a higher level than a first light output surface 309 of the LEDs 302 then the UV light is prevented from reaching the other parts of the lighting device, thereby protecting the device from UV light exposure.

Figure 4:
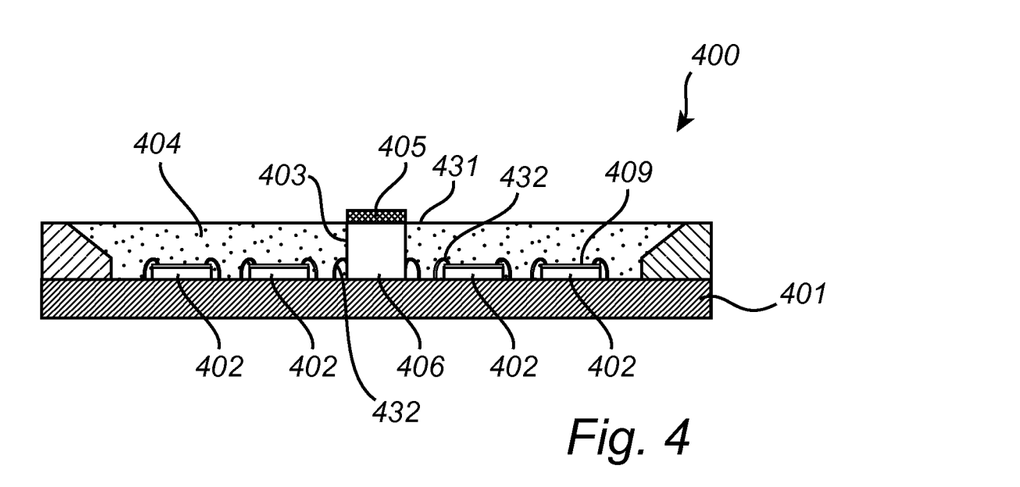
FIG. 4 shows a side view of a lighting device according to an embodiment.

With reference to FIG. 4, an embodiment of the present disclosure is described. FIG. 4 shows a lighting device 400 where a plurality of LEDs 402 is mounted on a substrate 401. A phosphor layer 404 may be disposed on at least the plurality of LEDs 402. The plurality of LEDs 402 may be covered by the phosphor layer 404. An UV LED 403 is mounted on the substrate 401 where the second light output surface 405 of the UV LED 403 may be at a higher level than at least one first light output surface 409 relative to the substrate 401 in the outgoing light direction. It will be appreciated that the first light output surface for emitting visible light may in this embodiment be considered to be the surface of the phosphor layer 404.

In the present embodiment, a base 406 of the UV LED 403 may be attached to the substrate 401, i.e. the UV LED 403 is not directly mounted on the substrate 401. The second light output surface 405 may be arranged at the opposite side of the base 406 relative to the substrate 401. For example, the second light output surface 405 may be the surface or the top part of the UV LED 403. The base 406 may be the part of the UV LED 403 that connects the UV LED 403 to the substrate 401. In some embodiments, the plurality of LEDs 402 may be embedded in the phosphor layer 404. In some embodiments the UV LED 403 may be directly connected to the substrate 401 without a base 406, however still with the output surface for emitting UV light being mounted at a higher level than the first output surface for emitting visible light.

In other words, the plurality of LEDs 402 is mounted on top of the substrate 401. The LEDs 402 are covered by the phosphor layer 404. The UV LED 403 is then mounted with the second light output surface 405 of the UV LED 403 above the surface 431 of the phosphor layer 404 in the outgoing light direction. The distance between the second light output surface 405 and the surface of the phosphor layer 404 may be in the range of 0.05 to 20 mm, such as for example in the range of 0.08 to 15 mm and even more specifically in the range of 0.1 to 12 mm in order to minimize degradation of the UV light reaching the LEDs 402 and the phosphor layer 404.

Thus, when the light beams emerge out from the second light output surface 405 of the UV LED 403, the light beams project away from the UV LED 403. The light beams from the UV LED 403 may then be prevented from reaching the material of the other LEDs 402 and the phosphor layer 404, thereby reducing degradation.

The base 406 may have a thickness that is larger than the thickness of the phosphor layer 404.

The base 406 may also be equipped with connectors 432 to electrically connect the UV LED 403 to the substrate 401. In an example embodiment, the connectors 432 may comprise at least two electrodes that connect the UV LED 403 to the substrate 401. The electrodes may for example be soldered between the UV LED 403 and the substrate 401.

The base 406 may be made of light reflective material such that light from the plurality of LEDs 402 is reflected against the base 406 out in the outgoing light direction. This material may include a metal. The base 406 may also include a layer or coating of scattering particles, thereby providing reflective properties. The scattering particles may be e.g. aluminum oxide (Al2O3), barium sulfate (BaSO4) and/or titanium dioxide (TiO2) in a polymer matrix such as a silicone matrix. The metal coating may be provided by deposition such as e.g. physical vapor deposition or chemical vapor deposition of aluminum (Al) or silver (Ag).

The base 406 may alternatively be made of light transmitting material such that light may propagate through the base 406. Some examples of such material would be transparent material such as quartz, glass or ceramic.

Figure 5:
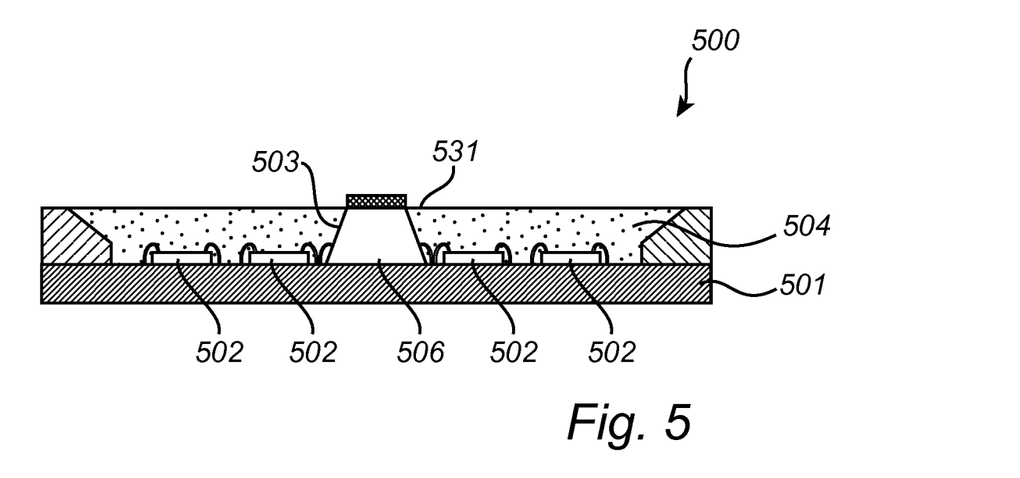
FIG. 5 shows a side view of a lighting device according to an embodiment in which the base of the UV LED has been shaped to improve light out-coupling.

FIG. 5 shows an embodiment of a lighting device 500, which is equivalent to the lighting device 400 described with reference to FIG. 4, with a substrate 501 and LEDs 502 covered by a phosphor layer 504 and an UV LED 503 mounted on the substrate 501, except that the UV LED 503 includes a base 506 of e.g. light reflecting material that may have a certain shape in order to improve the light outcoupling. In particular, a lateral width of the base 506 close to the substrate 501 may be larger than a lateral width of the base 506 at the surface 531 of the phosphor layer 504. In other words, the lateral width of the base 506 may decrease along the outgoing light direction from the substrate 501 to the surface 531 of the phosphor layer 504. The base 506 of the UV LED 503 may therefore include two inclined walls extending through the phosphor layer 504. As a result, the light from the LEDs 502 may be reflected against the inclined walls of the base 506 out of the lighting device 500 in the outgoing light direction.

Figure 6A:
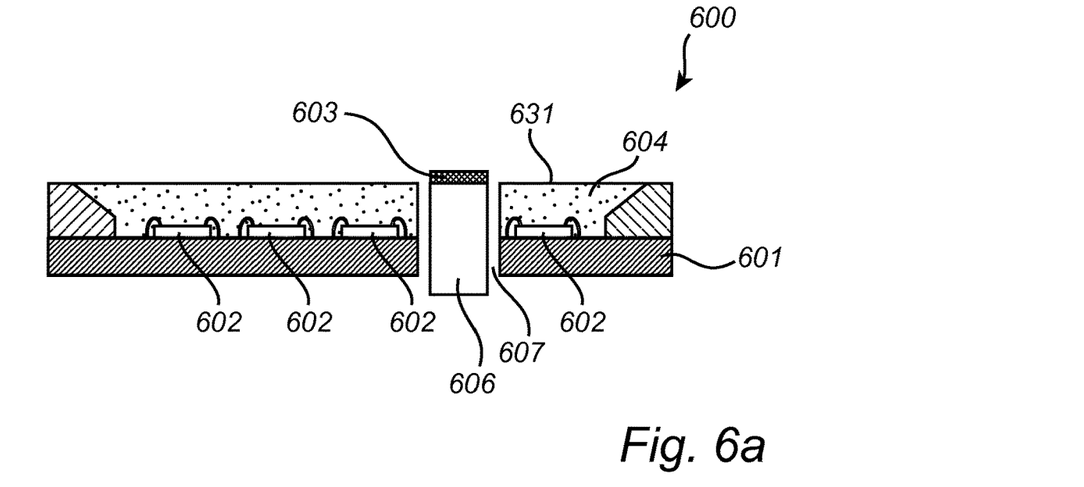
FIG. 6a shows a side view of a lighting device with a substrate comprising a hole for insertion of the UV LED according to an embodiment.

With reference to FIG. 6a, a lighting device 600 according to another embodiment is shown, which is equivalent to the lighting device 400 with a substrate 601 and a plurality of LEDs 602 covered by a phosphor layer 604, except that the lighting device 600 comprises a hole 607 in its substrate 601. The hole 607 may be configured to hold at least one UV LED 603. The hole 607 may extend through the whole substrate 601 and the phosphor layer 604.

The hole may in some embodiments have a shape such that the lateral width of the base 606 close to the substrate 601 is larger than a lateral width of the base 606 at the surface 631 of the phosphor layer 604 in order to encompass a shape of the UV LED 603 as described in connection to FIG. 5 above. In some embodiments, there may be two or more holes 607 at different positions in the substrate 601. The holes 607 may provide already fixed positions in the substrate 601, thereby facilitating the attachment/mounting of one or more UV LEDs 603.

Figure 6B:
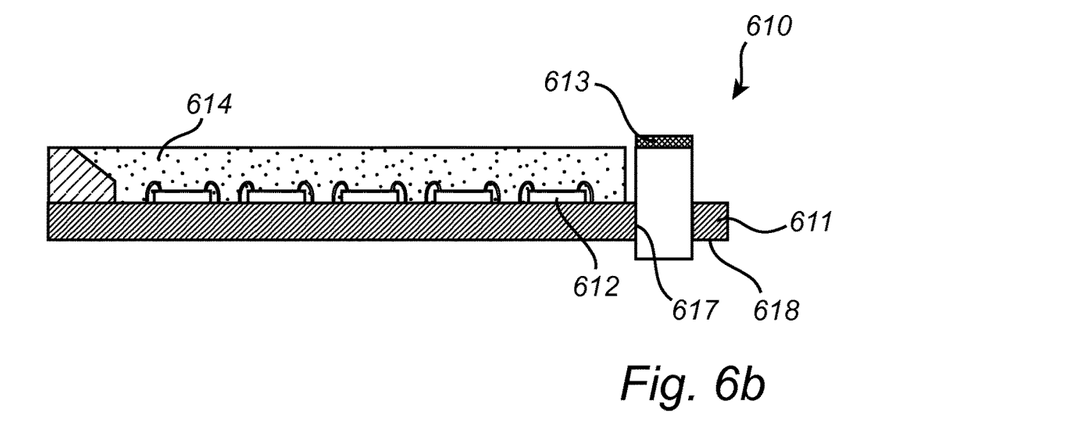
FIG. 6b shows a side view of a lighting device with a substrate comprising a hole positioned at its edge according to an embodiment.

With reference to FIG. 6b, a lighting device 610 according to another embodiment is shown, which is equivalent to the lighting device 600 with a substrate 611 and a plurality of LEDs 612 covered by a phosphor layer 614, except that the hole 617 configured to hold the UV LED 613 is positioned at an edge 618 of the substrate 611. In this embodiment, the hole 617 may be placed outside of the phosphor layer 614 which may facilitate the manufacturing and assembly of the lighting device 620.

Figure 6C:
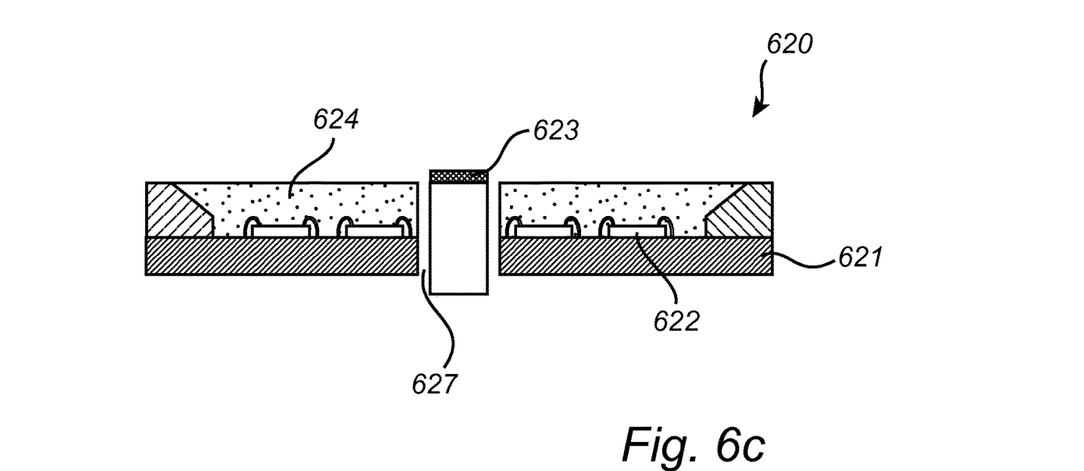
FIG. 6c shows a side view of a lighting device with a substrate comprising a hole positioned at its center according to an embodiment.

With reference to FIG. 6c, a lighting device 620 according to another embodiment is shown, which is equivalent to the lighting device 600 with a substrate 621 and a plurality of LEDs 622 covered by a phosphor layer 624, except that the hole 627 configured to hold at least one UV LED 623 is positioned in the center of the substrate 621.

As an alternative to using connection via a hole in the substrate, the UV LED may be an individual surface mounted device (SMD) UV LED. The SMD UV LED may be mounted on top of the substrate or the phosphor layer without being electrically connected to the substrate and the other LEDs. The plurality of LEDs may be configured as LED chips on the CoB. Thus, the SMD UV LEDs may easily be integrated at different positions on the substrate or the phosphor layer.

The plurality of LEDs on the CoB may be configured to produce colored light or white light or a combination of both colored and white light.

Figure 7:
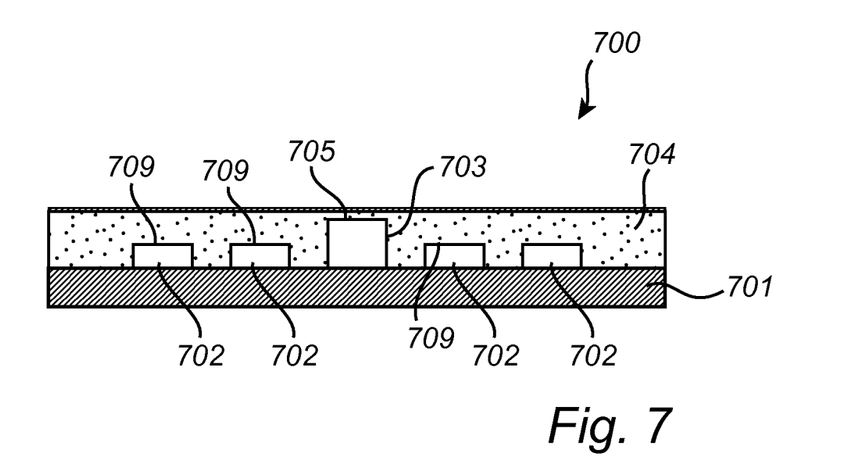
FIG. 7 shows a side view of a lighting device in which both the LEDs and the at least one UV LED are covered by the phosphor layer according to an embodiment.

FIG. 7 shows an embodiment of a lighting device 700, which is equivalent to the lighting device 400 described with reference to FIG. 4, with a substrate 701 and LEDs 702 covered by a phosphor layer 704 and an UV LED 703 mounted on top of a based mounted on the substrate 701, except that also the at least one UV LED 503 is covered by a phosphor layer 704. The phosphor layer 704 on top of the at least one UV LED 703 may be thinner than the phosphor layer 704 on top of the LEDs 702. In this way, the second light output surface 705 of the at least one UV LED 703 is mounted at a higher level than the at least one first light output surface 709 relative to the substrate 701 in the outgoing light direction. The UV light may then be prevented from reaching the other LEDs 402, thereby reducing degradation.

Figure 8:
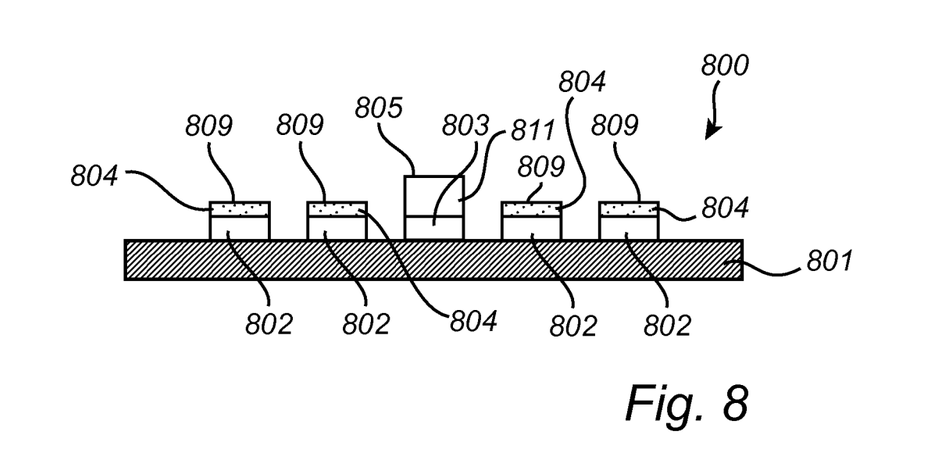
FIG. 8 shows a side view of a lighting device in which a light transmitting material is disposed on top of the UV LED according to an embodiment.

FIG. 8 shows another embodiment of a lighting device 800, which is equivalent to the lighting device 400 described with reference to FIG. 4, with a substrate 801, LEDs 802 and an UV LED 803 mounted on the substrate 801, except that each LED has its own phosphor layer 804. As an alternative, the phosphor layer 804 may be a continuous phosphor layer as in FIG. 4. A layer of light transmitting material 811 is disposed on top of the UV LED 803 such that a second light output surface 805 is elevated relative to the at least one first light output surface 809 emitting visible light. The second light output surface 805 is the surface of the layer of light transmitting material 811 which is opposite to the surface of the layer 811 in contact with the UV LED 803. As a result, the second light output surface 805 may be at a higher level than the at least one first light output surface 809 relative to the substrate 801 in the outgoing light direction. The light transmitting material 811 may be a light transparent material such as e.g. glass, quartz, ceramic or a polymeric material.

Some example of embodiments for implementation may be lamps, e.g. spotlights, or luminaires.

According to a second aspect of the present disclosure, a method for manufacturing a lighting device is described. With reference to FIGS. 1-4, an embodiment of the manufacturing process of the lighting device may be described.

As shown in FIG. 1, the manufacturing may include bonding of a plurality of LEDs 102 on a substrate 101 for emitting visible light from at least one first light output surface in an outgoing light direction The plurality of LEDs 102 may be electrically connected to the substrate 101, by soldering electrodes between the LEDs 102 and the substrate 101. FIG. 3 illustrates that the manufacturing method may include mounting at least one UV LED 303 on the substrate 301 for emitting UV light from a second light output surface 405 in the outgoing light direction. With reference to FIG. 2, the manufacturing method may include providing a phosphor layer 204 on at least the plurality of LEDs such that the plurality of LEDs 202 is covered by the phosphor layer 204. The at least one UV LED may be mounted in accordance with any of the embodiments described above with reference to FIGS. 1-8. As a result, referring e.g. to FIG. 4, the second light output surface 405 (of the at least one UV LED 403) from which the UV light exits the lighting device is mounted at a higher level than the at least one first light output surface 431 relative to the substrate 401 in the outgoing light direction.

In some embodiments, the plurality of LEDs 402 may be embedded by the phosphor layer. In an embodiment the phosphor layer 404 may also be provided over the at least one UV LED 403 as may be seen in FIG. 7. The phosphor layer 704 on top of the at least one UV LED 703 may be thinner than the phosphor layer 704 on top of the LEDs 702 such that the second light output surface 705 of the at least one UV LED 703 may be mounted at a higher level than the at least one first light output surface 709 relative to the substrate 701 in the outgoing light direction. For illustrative purposes only, the phosphor 704 on top of the LEDs 702 may be at least twice as thick as the phosphor layer on top of the at least one UV LED 703. In other examples, the phosphor layer 704 on top of the UV LED 705 may be less than 100 micrometers thick while the phosphor layer on top of the LEDs 702 may be more than 100 micrometers thick.

The bonding of the plurality of LED may be made by wire bonding. The phosphor layer may in some cases be dispersed in a silicone matrix to cover the LEDs. For illustrative purposes only, each of the LEDs may be considered to have a certain width W and a certain length L (i.e. the dimensions of the LEDs in a plane as defined by the substrate on which they are mounted). The LEDs may be spaced from each other by a distance D. In some embodiments, the distance D (the spacing between the LEDs) may be less than five times the width W and the length L of the LEDs (D<5 W and D<5 L). It will be appreciated that in some applications, the width W of a LED may be equal to its length L. Further, the thickness of the phosphor layer may be larger than the width W and/or the length L of the LEDs.

Specific embodiments of the invention have now been described. However, several alternatives are possible, as would be apparent for someone skilled in the art.

The person skilled in the art realizes that the present invention by no means is limited to the preferred embodiments described above. On the contrary, many modifications and variations are possible within the scope of the appended claims. Additionally, variations to the disclosed embodiments can be understood and effected by those skilled in the art in practicing the claimed invention, from a study of the drawings, the disclosure, and the appended claims. The mere fact that certain measures are recited in mutually different dependent claims does not indicate that a combination of these measures cannot be used to advantage. Any reference signs in the claims should not be construed as limiting the scope.

The invention claimed is:

1. A lighting device comprising:
 a plurality of light emitting diodes, LEDs, the plurality of LEDs being disposed on a substrate for emitting visible light from at least one first light output surface in an outgoing light direction;
 at least one ultra violet light emitting diode, UV LED, for emitting UV light from a second light output surface in the outgoing light direction, and
 a phosphor layer disposed on at least the plurality of LEDs such that said LEDs are covered by the phosphor layer;
 wherein the second light output surface for emitting UV light from said at least one UV LED is mounted at a higher level than said at least one first light output surface relative to the substrate in the outgoing light direction
 wherein the plurality of LEDs is configured to produce colored light and/or white light.

2. The lighting device according to claim 1, wherein said at least one UV LED is covered by said phosphor layer, wherein said phosphor layer on top of the at least one UV LED is thinner than the phosphor layer on top of the LEDs.

3. The lighting device according to claim 1, wherein said at least one UV LED is disposed on a base arranged on said substrate such that the second light output surface is elevated relative to said at least one first light output surface in the outgoing light direction.

4. The lighting device according to claim 3, wherein said base has a thickness which is larger than the thickness of the phosphor layer.

5. The lighting device according to claim 3, wherein said base is equipped with connectors to electrically connect said at least one UV to the substrate.

6. The lighting device according to claim 3, wherein said base comprises a light transmitting material.

7. The lighting device according to claim 3, wherein said base comprises a light reflective material.

8. The lighting device according to claim 3, wherein a lateral width of said base close to the substrate is larger than a lateral width of said base at the surface of the phosphor layer.

9. The lighting device according to claim 1, wherein a layer of light transmitting material is disposed on top of the UV LED such that the second light output surface is elevated relative to said at least one first light output surface in the outgoing light direction.

10. The lighting device according to claim 1, wherein said substrate comprises a hole configured to hold the at least one UV LED.

11. The lighting device according to claim 10, wherein the hole is positioned at an edge or the center of the substrate.

12. The lighting device according to claim 1, wherein said at least one UV LED is an individual surface mounted device, SMD UV LED.

13. A lamp or a luminaire comprising a lighting device according to claim 1.

14. Method for manufacturing a lighting device, said method comprising:
 bonding a plurality of LEDs on a substrate for emitting visible light from at least one first light output surface in an outgoing light direction,
 electrically connecting the plurality of LEDs together,
 mounting at least one UV LED on the substrate for emitting UV light from a second light output surface in the outgoing light direction, and
 providing a phosphor layer on at least the plurality of LEDs such that said LEDs are covered by the phosphor layer,
 wherein the second light output surface for emitting UV light from said at least one UV LED is mounted at a higher level than said at least one first light output surface relative to the substrate in the outgoing light direction,
 wherein the plurality of LEDs is configured to produce colored light and/or white light.

* * * * *